(12) United States Patent
Abali et al.

(10) Patent No.: US 9,836,238 B2
(45) Date of Patent: Dec. 5, 2017

(54) HYBRID COMPRESSION FOR LARGE HISTORY COMPRESSORS

(71) Applicant: International Business Machines Corporation, Armonk, NY (US)

(72) Inventors: Bulent Abali, Tenafly, NJ (US); Peter A. Franaszek, Mount Kisco, NY (US); Luis A. Lastras, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 130 days.

(21) Appl. No.: 14/985,459

(22) Filed: Dec. 31, 2015

(65) Prior Publication Data

US 2017/0192708 A1    Jul. 6, 2017

(51) Int. Cl.
| | |
|---|---|
| *H03M 7/34* | (2006.01) |
| *G06F 3/06* | (2006.01) |
| *G06F 12/1018* | (2016.01) |
| *H03M 7/30* | (2006.01) |
| *G11C 7/10* | (2006.01) |
| *G06F 12/02* | (2006.01) |

(52) U.S. Cl.
CPC .......... *G06F 3/0638* (2013.01); *G06F 3/0604* (2013.01); *G06F 3/0656* (2013.01); *G06F 3/0685* (2013.01); *G06F 12/1018* (2013.01); *G06F 3/067* (2013.01); *G06F 12/0292* (2013.01); *G06F 2212/205* (2013.01); *G06F 2212/65* (2013.01); *G11C 7/1006* (2013.01); *H03M 7/30* (2013.01)

(58) Field of Classification Search
CPC ........ H03M 7/30; G11C 7/1006; G06F 3/067; G06F 12/0292

USPC ............ 341/51, 55, 106; 711/104, 154, 202
See application file for complete search history.

(56) References Cited

U.S. PATENT DOCUMENTS

| | | |
|---|---|---|
| 6,839,256 B1 | 1/2005 | Proebsting et al. |
| 2007/0061546 A1* | 3/2007 | Berger .................... H03M 7/30 711/202 |
| 2009/0190386 A1 | 7/2009 | Kim et al. |
| 2010/0228912 A1 | 9/2010 | Huang et al. |
| 2011/0289263 A1 | 11/2011 | McWilliams et al. |
| 2015/0127621 A1 | 5/2015 | Kuo |

(Continued)

FOREIGN PATENT DOCUMENTS

| | | |
|---|---|---|
| WO | WO 2004112350 A1 | 12/2004 |
| WO | WO 2005050663 A1 | 6/2005 |

OTHER PUBLICATIONS

Chi-Neng Wen et al, "NUDA—A Non-Uniform Debugging Architecture and Non-Intrusive Race Detection for Many-Core Systems", 2012.

*Primary Examiner* — Joseph Lauture
(74) *Attorney, Agent, or Firm* — Whitham, Curtis & Cook, PC; Daniel P. Morris

(57) ABSTRACT

A compression engine and method for optimizing the high compression of a content addressable memory (CAM) and the efficiency of a static random access memory (SRAM) by synchronizing a CAM with a relatively small near history buffer and an SRAM with a larger far history buffer. An input stream is processed in parallel through the near history and far history components and an encoder selects for the compressed output the longest matching strings from matching strings provided by each of the near history and far history components.

18 Claims, 6 Drawing Sheets

(56) References Cited

U.S. PATENT DOCUMENTS

| | | |
|---|---|---|
| 2015/0362972 A1 | 12/2015 | Frick |
| 2016/0283159 A1 | 9/2016 | Gopal et al. |
| 2016/0291891 A1 | 10/2016 | Cheriton |
| 2016/0342333 A1 | 11/2016 | Wheeler et al. |
| 2016/0371190 A1 | 12/2016 | Romanovskiy |
| 2017/0090776 A1 | 3/2017 | Kowles |

* cited by examiner

HYBRID COMPRESSION FOR LARGE HISTORY COMPRESSORS

RELATED APPLICATION

This invention is related to contemporaneously filed U.S. patent application Ser. No. 14/985,460, having the same title, whose entire content and disclosure, including drawings, are hereby incorporated by reference into the present application.

BACKGROUND OF THE INVENTION

Field of the Invention

The present invention generally relates to compression algorithms and more particularly to compression algorithms whose design accounts for the memory hardware used by the algorithm.

Background Description

Lempel Ziv (LZ) based compression encoders replace a repeating string in the input data stream with a pointer to a previous copy of the string in the compressed output stream. Pointers typically use fewer bits than the strings themselves, which is how the data compression is achieved (e.g. output becomes smaller than input.) Compression algorithms typically retain the most recently processed input data in order to discover the repeated strings. ALDC (Adaptive Lossless Data Compression) and ELDC (Embedded Lossless Data Compression) implementations of the LZ algorithm are described in the following references: J. Ziv and A. Lempel, "A universal algorithm for sequential data compression," IEEE Trans. Inform. Theory, vol. IT-23, no. 3, pp. 337-343, 1977; D. J. Craft, "A fast hardware data compression algorithm and some algorithmic extensions," IBM Journal of Research and Development, Volume 42 Issue 6, November 1998 Pages 733-745; M. J. Slattery and F. A. Kampf, "Design considerations for the ALDC cores," IBM Journal of Research and Development, Volume 42 Issue 6, November 1998, Pages 747-752; and ECMA standard 222 "Adaptive Lossless Data Compression Algorithm," which specifies a lossless compression algorithm to reduce the number of bytes required to represent data.

For example, the ALDC and ELDC implementations use a 16 KB history buffer; that is they retain the most recent 16 kilobytes of input data to search for repetitions in the input. Both algorithms are used in tape data storage systems. The history buffer may be referred as the "window" or "sliding window" in the literature. While we use ELDC, ALDC and a 16 KB history in the exemplary embodiment, the invention is applicable to all LZ based embodiments of data compression and for any size history buffers. The term "dictionary" refers to the information retained by the compression encoder while it searches for repetitions in input; for example, a dictionary may contain the first few bytes of an input string and a pointer or some indication as to where that string might be located in the history of an input stream. Different compression encoder implementations may use different size history buffers.

Lempel Ziv (LZ) based compression encoders implemented in hardware commonly use a Content Addressable Memory (CAM) for remembering the history of input phrases entered into the compression dictionary. For data compression purposes, a CAM detects if the current input byte matches any other bytes in the history buffer. The CAM provides all possible matches in the history buffer and their distances from the current input. As more input bytes arrive and at some point in time, the input stream will stop matching the history buffer. Then, the encoder will choose the longest matching string in the history and will replace the current input string with a pointer to the previous copy. Thus, a CAM is advantageous in finding the longest matching strings in the input. However, a CAM is typically very hardware intensive, in terms of silicon area and power consumption, thereby increasing the cost and complexity of hardware compression encoders.

Alternative to a CAM is a Static Random Access Memory (SRAM) based dictionary which uses hashing to store previously seen input phrases. An SRAM based dictionary is more efficient in terms of silicon area and power compared to a CAM. However, unlike a CAM, an SRAM based dictionary cannot detect all the matches in the input stream. Typically, only the most recent references to phrases in the history buffer may be retained in an SRAM based dictionary. Older references may be discarded from the dictionary due to lack of space or due to hash collisions (e.g. other phrases competing for the same location in the dictionary.)

SUMMARY OF THE INVENTION

It is therefore an object of the present invention to provide a hybrid CAM/SRAM based data compression engine which combines the beneficial properties of the two history schemes.

An aspect of the invention is a compression engine for large history compressors, comprising a near history component implemented in first type of memory, a far history component implemented in second type of memory, wherein matching in the near history is synchronized with matching in the far history to generate a compressed output. In a further aspect of the invention the near history component is implemented in content addressable memory (CAM) and the far history component is implemented in static random access memory (SRAM).

In yet another aspect of the invention an input stream is processed in parallel by both the near history component and the far history component, the near history component providing all possible matches between current input and a near history buffer and the far history component detecting matches between current input and a far history buffer via a hash table of tokens of current input. Another aspect of the invention comprises an encoder selecting for the compressed output a longest matching string from among matching strings provided by the near history component and the far history component. It is also an aspect of the invention that the encoder sends a reset signal to the near history component if the longest matching string is selected from the far history component and the encoder sends a reset signal to the far history component if the longest matching string is selected from the near history component.

In another aspect, the invention additionally comprises a far history buffer for storing an input string at a next buffer address, and a hash table for storing said next buffer address at a hash of a token of said input string. In a further aspect, the hash table contains a set of entries for each hash value. In yet other aspects of the invention a token for a current input is matched to a prior location in the far history buffer, the match of the token is extended to include a next input, and a longest matching string is sent to the encoder when the match cannot be extended to a next input.

The main idea of the invention is to use a small Content Addressable Memory (CAM) for the near history and use a large hash based Static Random Access Memory (SRAM) for the far history. For example, a small CAM might be 1 KB and a large SRAM might be 16 KB or 64 KB. We observed that for many data streams, most of the compression benefit occurs in the near history; in other words, typically more matches occur near each other than far away from each other. Therefore, it is more cost effective to use a CAM with large hardware area and power only for the near history, where the most compression benefit occurs. The remaining compression benefit occurs in the far history: there, it is more cost effective to use an SRAM based dictionary with small hardware area and lower power, because that is where a smaller compression benefit occurs.

FIG. 1 demonstrates this observation: a sample input file was compressed. With a 1 KB history buffer, the file size reduced from 8 bits per character to 3.8 bits per character, a 53 percent reduction in size. Increasing the history buffer from 1 KB to 16 KB provided marginal benefit.

The methods for synchronizing the operation of CAM and hash based SRAM dictionaries include: a) utilize a small CAM, e.g. 1 KB CAM design, storing and tracking the most recent 1 KB history; b) a 16 KB history buffer (SRAM based) to store the most recent 16 KB of input; c) a hash table (SRAM based) dictionary for storing pointers to the 16 KB history buffer. Both the history buffer and the hash table can use existing library SRAM macros available in the chosen hardware technology. The hash table is used for locating 3 or 4 byte character strings (called tokens) in the 16 KB history buffer. A token serves as a starting point for locating equal length or longer strings in the history.

When the 1 KB CAM unit and the 16 KB dictionary unit both match the current input token (at the same time), they simultaneously start tracking the input stream and comparing the input stream to the older input stored in their respective history buffers. One of the two units producing the longest matching string wins, which is then encoded in the compressed output.

The benefit of this hybrid 16-1 scheme is that a) the SRAM based design is less complex and less area intensive than a 16K CAM, and b) data shows that the largest compression benefit comes from the near 1 KB history; using a CAM for 16 KB history may be overkill. Further in history the compression benefit proportionally decreases; an SRAM based 16K dictionary may be sufficient as a tradeoff.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
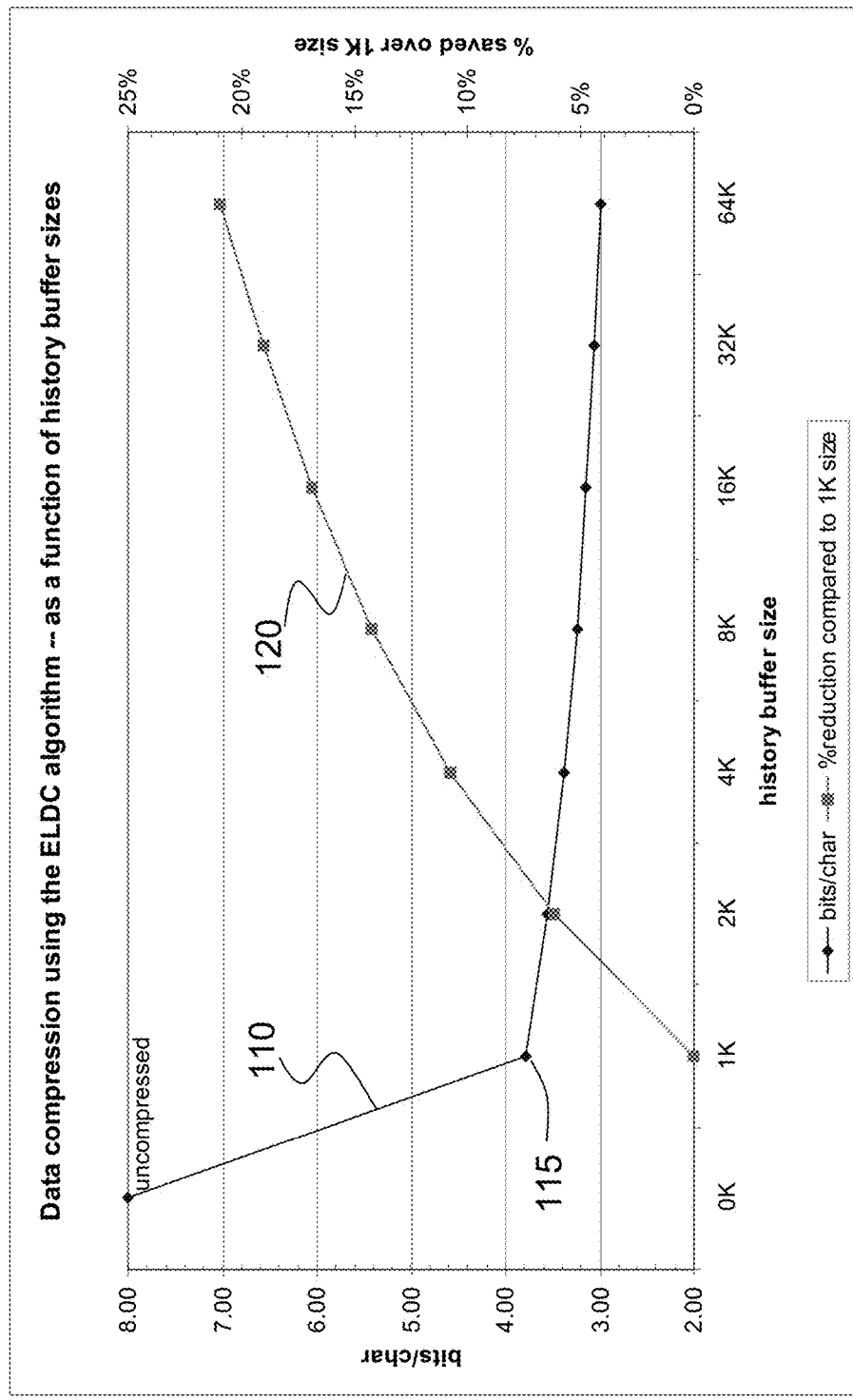
FIG. 1 is a chart showing compression efficiency as a function of history buffer sizes of a compression algorithm called Embedded Lossless Data Compression (ELDC) algorithm commonly used in tape data storage systems.

Referring now to the drawings, and more particularly to FIG. 1, there is shown the data on compression as a function of history buffer size leading the inventors to develop the partitioning of memory requirements between a near history and a far history. Graph line 110 shows data compression using the ELDC algorithm as measured by the bits/char scale on the y-axis on the left side of the graph dependent upon history buffer size shown on the x-axis. A substantial compression from 8 bits/char (uncompressed) to less than 4 bits/char 115 is observed with a 1K history buffer, with diminishing compression improvement approaching 3 bits/char as the history buffer size is increased up to 64K. Graph line 120 shows the additional but diminishing compression improvement as a percentage of the compression achieved using a 1K history buffer. The percentage is measured by the y-axis scale on the right side of the graph dependent upon history buffer size shown on the x-axis.

Figure 2:
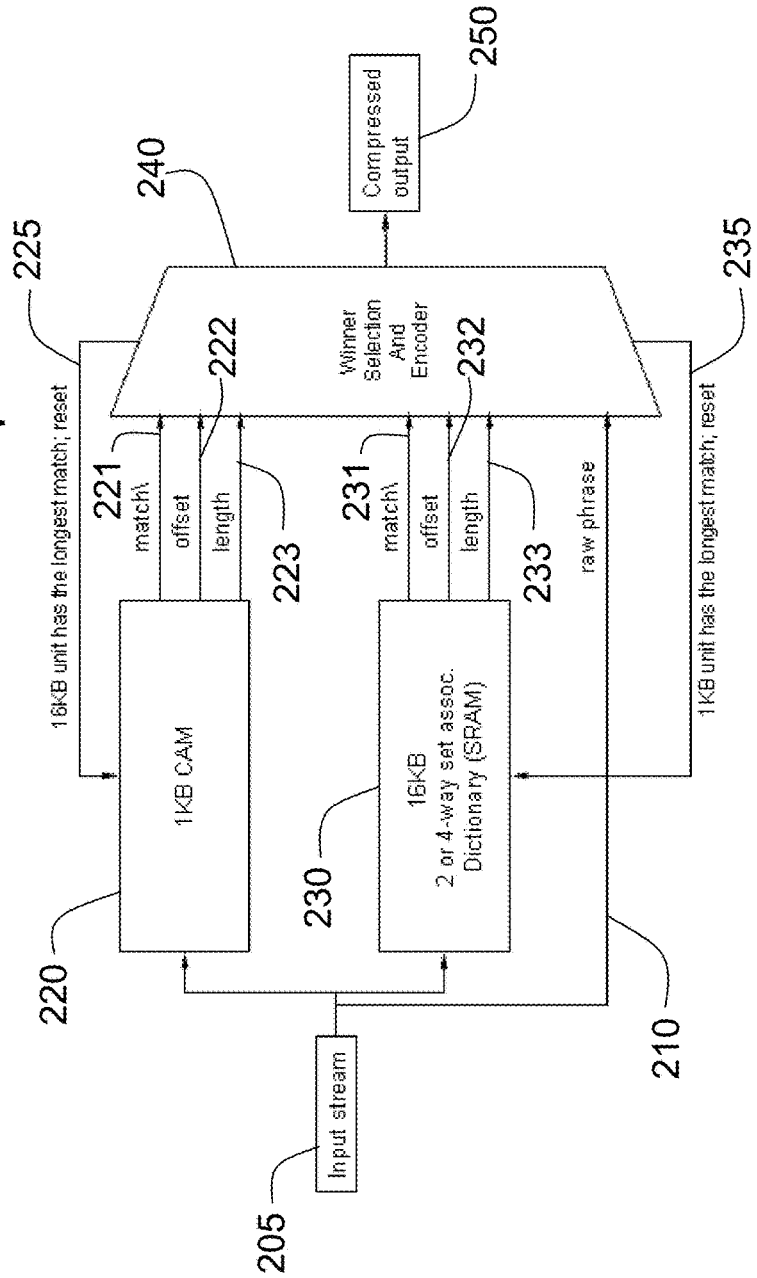
FIG. 2 is a schematic diagram showing coordination between the 1K CAM and the 16K dictionary.

As shown in FIG. 2, the hybrid compression system includes a 1 KB CAM based dictionary 220 and a 16 KB SRAM based dictionary 230 both of which try to find repetitions in the input stream 205, and an encoder unit 240 that selects the longest string on the raw phrase 210 among many matching strings (221,231) discovered by both units, based on the offset (222,232) and length (223,233) in relation to the raw phrase 210. When the longest string selected by the encoder 240 is from the 1 KB CAM dictionary 220 the encoder 240 sends a reset signal to the 16 KB SRAM dictionary 230, and when the longest string is from the 16 KB SRAM dictionary 230 the encoder 240 sends a reset signal to the 1 KB CAM dictionary 220. The 1 KB CAM 220 retains the recent 1 KB history but it can discover the longest possible match within that history with 100% certainty. The 16 KB Hash based dictionary 230 retains much longer history, but with a small probability it can forget the location of the longest possible match within that 16 KB history.

Each reset signal (225,235) indicates to its respective dictionary (220,230) that the other dictionary has found a longer matching string (winner). Therefore, the losing dictionary may stop its matching procedure until the winning dictionary stops matching the input string, i.e. removal of the reset signal.

Figure 3:
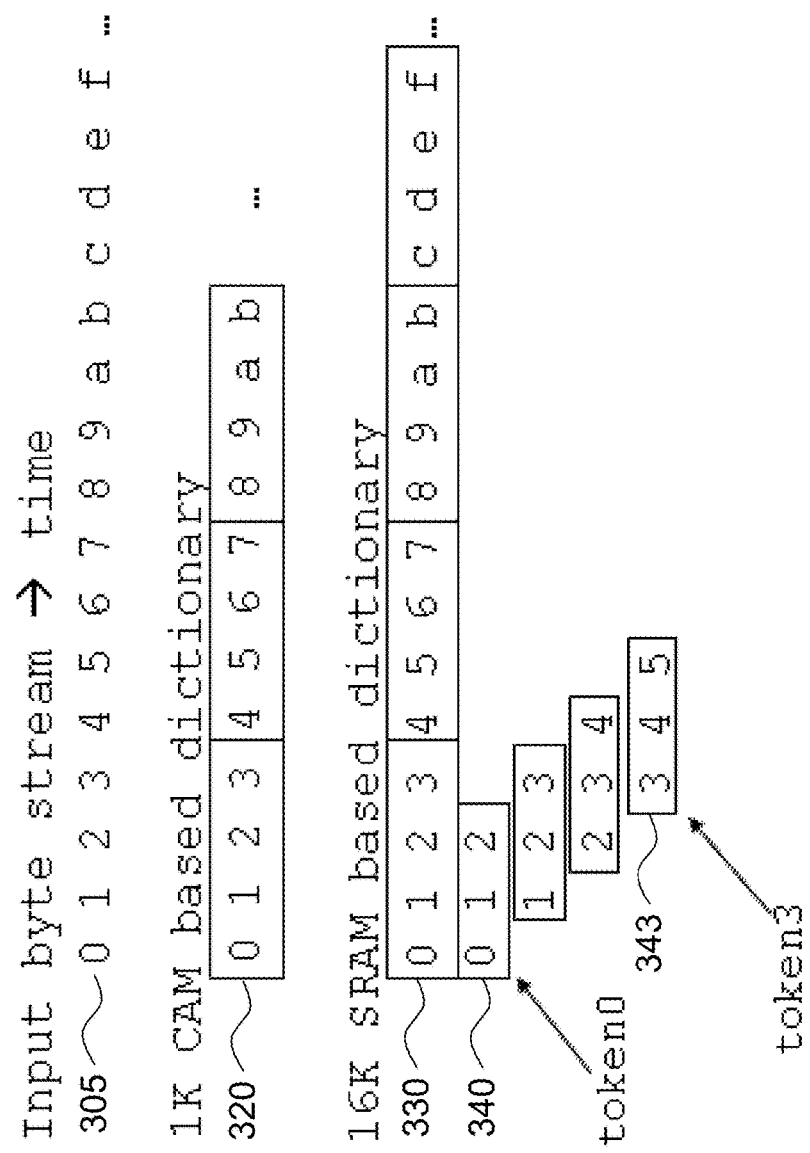
FIG. 3 is a schematic showing how the input stream of bytes is allocated over the CAM and hash based dictionaries.

As shown in FIG. 3, input 305 is fed to the 1 KB CAM 320 and the 16 KB dictionary 330 in parallel. The 16 KB dictionary 330 tokenizes the input bytes in units of 3 or 4 bytes for a more selective dictionary lookup to eliminate too many short length matches, e.g. those that are shorter than 3 bytes. Token units of 3 bytes (e.g. token0 340 and token3 343) are shown in FIG. 3. However, other token sizes are possible without violating the spirit of the invention. The token is then used for searching the history buffer.

The CAM unit need not tokenize the input, as by design and definition a CAM can locate all 1 byte matches in its memory in a single cycle. The CAM unit will later eliminate those short length matches, by whittling down the list of matches as more input bytes arrive, finally resulting in a single longest matching string in the 1 KB history.

Figures 4, 5:
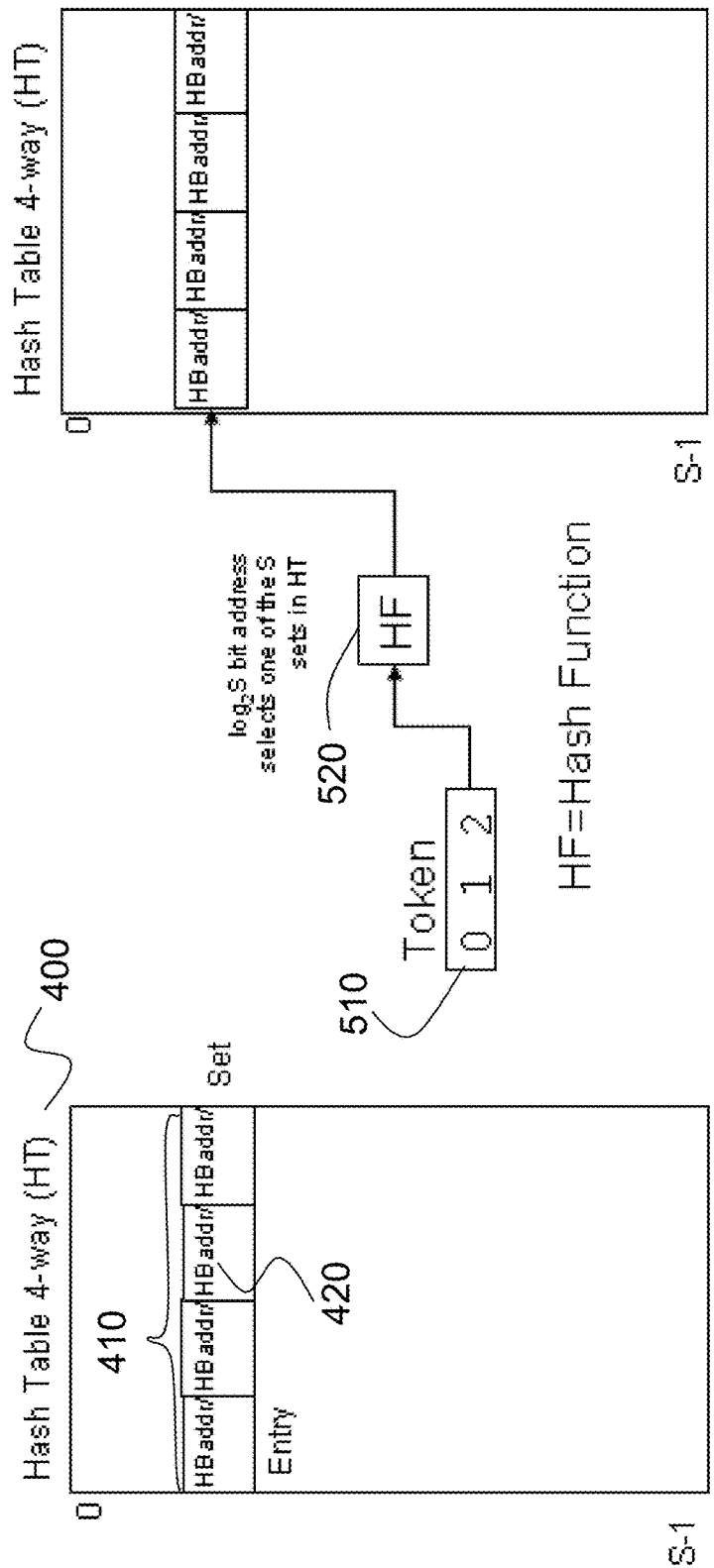
FIG. 4 shows a four-way hash table.
FIG. 5 is a schematic showing how the input stream is loaded into a four-way hash table.

The SRAM based dictionary is comprised of an SRAM based hash table (HT) and an SRAM based history buffer. The hash table and its operation are shown in FIGS. 4 and 5. A hash table (HT) 400 is used to identify the history buffer location or locations of an input token 510 by using a hash function 520 to compute a hash value between zero and S−1 in a hash table 400 with S entries. HT operates similar to a direct mapped or an N-way set associative computer cache memory. In a typical embodiment, N=2 or N=4 is feasible, however to those skilled in the art it will be obvious that other N values are possible without violating the spirit of the invention. With larger associativity values N, HT retains more repetitions of the same token. For example in the N=4 case, as shown in FIG. 4, a token may be matched to up to four separate locations in the history buffer, as each HT set (e.g. 410) can retain four pointers. Each HT set contains N entries and each HT entry contains a pointer to the history buffer, referred to as HB address (e.g. 420) in FIG. 4.

Similar to that of computer cache organizations the hash table implements a replacement policy which determines which entry to evict from an HT set when the set is full. For example, in the 4-way HT example of FIG. 4, when a new, 5th token maps to a full set, the Least Recently Used (LRU) policy will replace one of the least recently used entries in the set with the new token. Those skilled in the art may employ other replacement policies such as first in first out (FIFO) or random replacement, or other policies without violating the spirit of the invention.

As with computer cache memories, the size of the hash table (i.e. the number of sets S) as well as the associativity impacts the hash table hit rate. Larger HT reduces collisions of tokens, which happens when different tokens hash in to the same set. In practice, design simulations may be used to determine the hash table size.

As shown in FIG. 5, a token is hashed in to a $\log_2 S$ bits of an HT address. The main purpose of the Hash function (HF) 520 is to provide a mapping from a token 510 to a set (e.g. 410) in the hash table. HF 520 is designed to ensure that the tokens are uniformly mapped across the entire hash table to maintain the expected hash table hit rate. Hash functions may be constructed by XOR'ing the token bits or using any other appropriate hashing function.

Figure 6A:
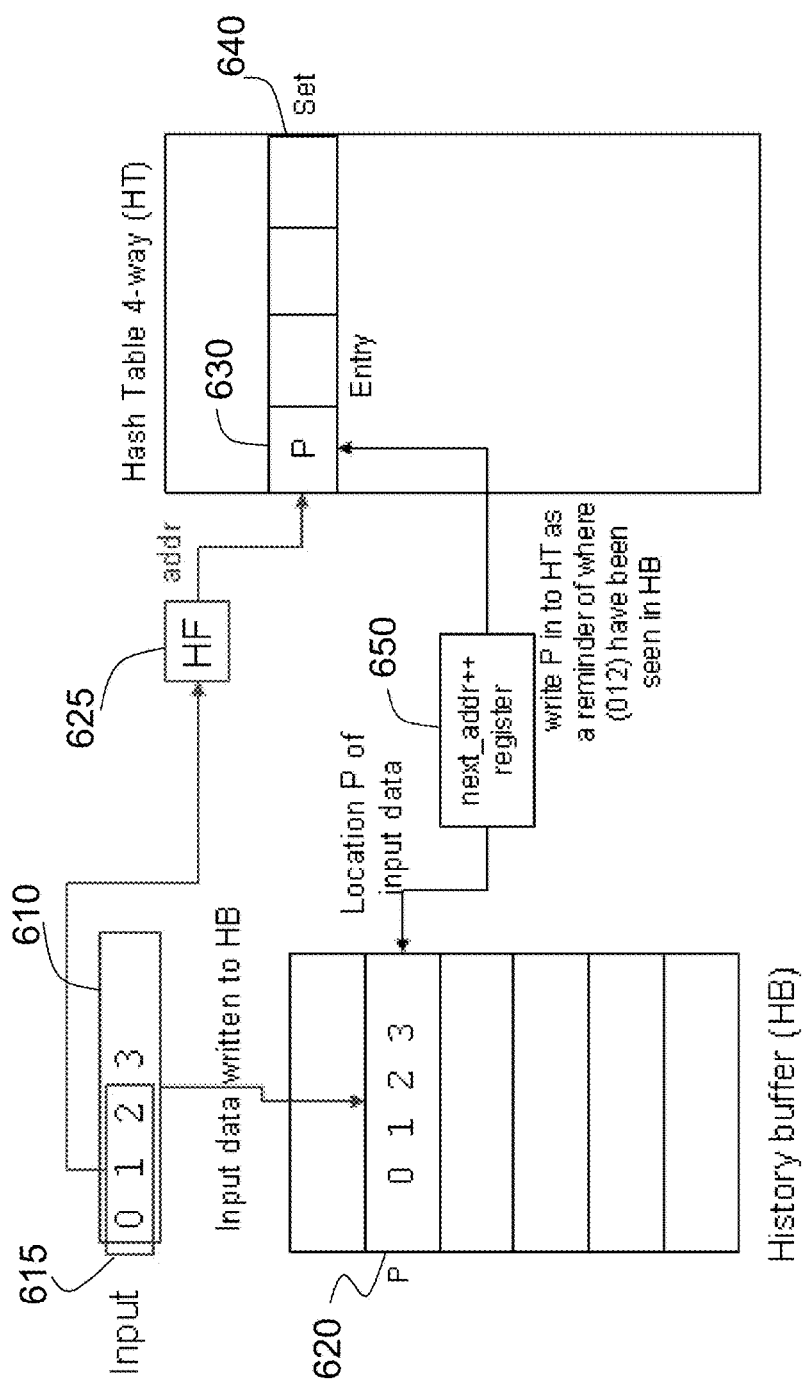
FIGS. 6A and 6B are schematics showing coordination between the history buffer and a four-way hash table.

FIG. 6A shows how HT is looked up (read) and updated (write). Let's examine the update operation first. The next_addr register 650 increments in each cycle; it always points to the next free history buffer (HB) location to which new input is written; in the example of FIG. 6A, the input (0 1 2 3) 610 is written to location P 620. In the same cycle, the next_addr register 650 value P is also written to the HT entry 630 in the set 640 responsible for remembering the HT location computed by hash function HF 625 of the 3 byte input token (0 1 2) 615; in other words: HT [HF(012)]←P. Now, the HT has a record of where the token (0 1 2) 615 has been seen in the 16 KB window.

Note that some of the tokens may span consecutive locations in HB, namely the locations P and P+1. Therefore, in one embodiment of the invention it may take two cycles to read HB. In another simplified embodiment in which two reads may not be possible, as a design tradeoff, matching of a token spanning consecutive locations will be forfeited and will result in a no history match.

Figure 6B:
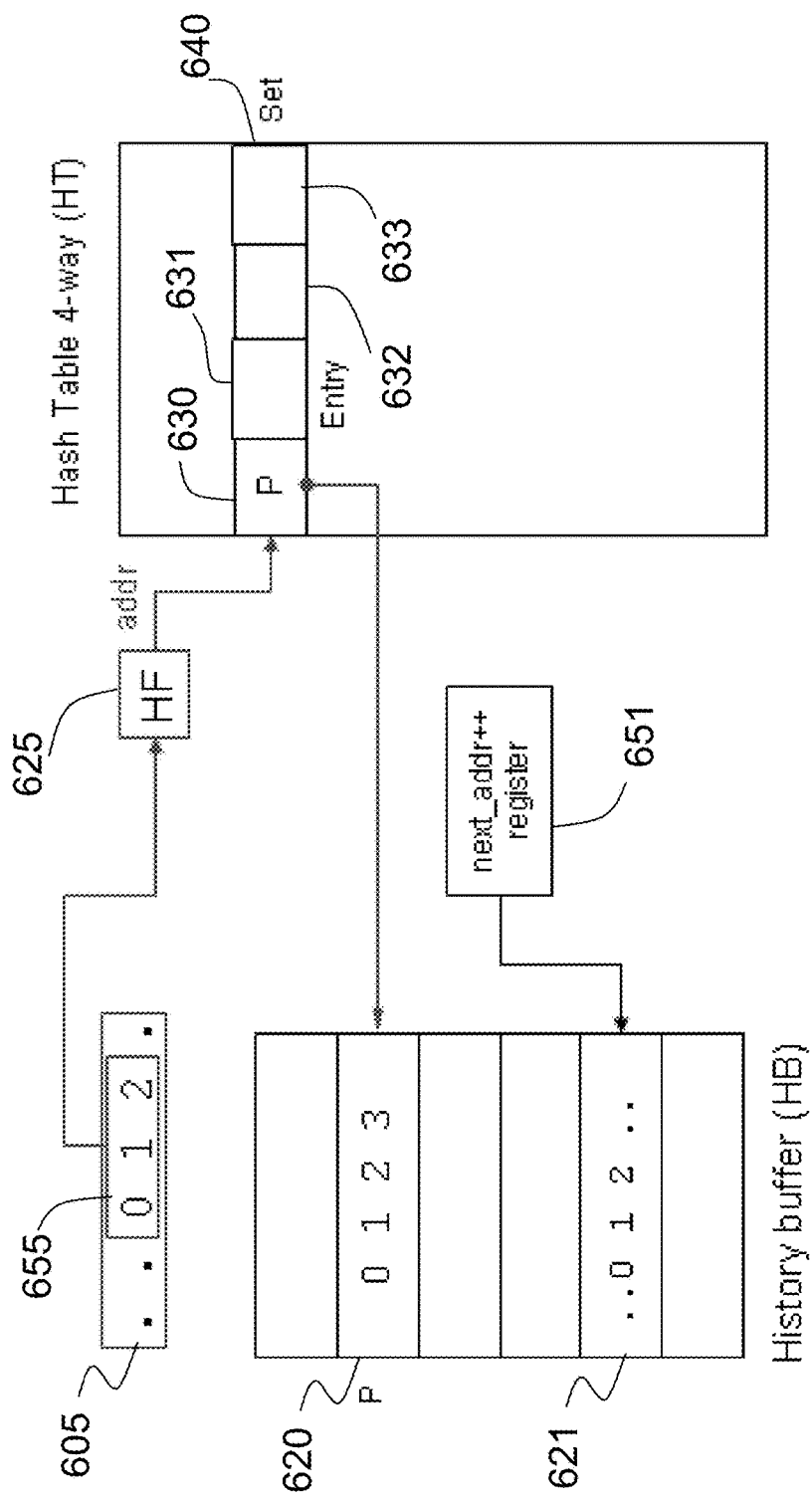

Using FIG. 6B, we can examine the HT lookup. Suppose the token (0 1 2) 615 repeats later in the input stream 605. The hash function HF 625 hashes the token (0 1 2) 665 to the same HT location set 640 as the previous occurrence of itself. Then, from HT entry 630 the address P is read. Now we have the address P 620 as a hint—with a high probability—where the previous occurrence of the token (0 1 2) may be found in HB.

Then, the location P 620 contents are read from HB. The read value is compared to the current input token 665 to determine if there is an actual match. If matched, then the pointer P is written in to a MATCH register M employed for tracking the location and length of matching strings. In an N-way organization, since up to N matches are possible, there will be N match registers M[0 . . . N−1] as well as N associated length registers to count match length of each. For example, in HT location set 640 there may be corresponding HB pointers in HT entries 630, 631, 632 and 633. The values in the HB corresponding to each of these pointers is read to determine if there is an actual match with token 655 in the same manner as with the value at location P 620, and if there is a match the pointer is written to the corresponding MATCH register M[0 . . . 3]. Regardless of its match status, the string 605 will be placed in the history buffer location 621 pointed to by the next_address register 651, and this location 621 will be remembered with an entry in the HT set 640, displacing an existing entry if no open entries are available.

Once a match starts hash table lookups cease. Instead each new byte after the matched token 655 in the input stream 605 is compared to next byte in the history buffer location in the M register, i.e. HB[M+1]. If the match is continuing, it means that there exists a longer matching string in the history buffer, and therefore the M and Length registers are incremented. The process repeats for all HB pointers in HT location set 640 until input bytes stop matching the history buffer, at which time the dictionary unit sends the longest match address and length to the compression encoder according to FIG. 2. After matches stop, the hash table lookup operation resumes for the next set of input bytes.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A compression engine for large history compressors, comprising:
   a near history component implemented in first type of memory;
   a far history component implemented in second type of memory wherein the near history component is implemented in content addressable memory (CAM) and the far history component is implemented in static random access memory (SRAM),
   wherein matching in the near history is synchronized with matching in the far history to generate a compressed output.

2. A compression engine as in claim 1, wherein an input stream is processed in parallel by both the near history component and the far history component, the near history component providing all possible matches between current input and a near history buffer and the far history component detecting matches between current input and a far history buffer via a hash table of tokens of current input.

3. A compression engine as in claim 2, further comprising an encoder, the encoder selecting for the compressed output a longest matching string from among matching strings provided by the near history component and the far history component.

4. A compression engine as in claim 3, wherein the encoder sends a reset signal to the near history component if the longest matching string is selected from the far history component and the encoder sends a reset signal to the far history component if the longest matching string is selected from the near history component.

5. A compression engine as in claim 2, wherein the far history component further comprises:
   a far history buffer for storing an input string at a next buffer address;
   a hash table for storing said next buffer address at a hash of a token of said input string.

6. A compression engine as in claim 5, wherein the hash table contains a set of entries for each hash value.

7. A compression engine as in claim 6, wherein a token for a current input is matched to a prior location in the far history buffer.

8. A compression engine as in claim 7, wherein the match of the token is extended to include a next input.

9. A compression engine as in claim 8, wherein a longest matching string is sent to the encoder when the match cannot be extended to a next input.

10. A compression method for large history compressors, comprising:
processing an input stream in parallel through a near history component and a far history component, the near history component being implemented in first type of memory and the far history component being implemented in second type of memory wherein the near history component is implemented in content addressable memory (CAM) and the far history component is implemented in static random access memory (SRAM);
synchronizing matching by the near history component with matching by the far history component;
generating a compressed output from the synchronized matching.

11. A compression method as in claim 10, wherein the near history component provides all possible matches between current input and a near history buffer and the far history component detects matches between current input and a far history buffer via a hash table of tokens of current input.

12. A compression method as in claim 11, further comprising selecting for the compressed output a longest matching string from among matching strings provided by the near history component and the far history component.

13. A compression method as in claim 12, further comprising sending a reset signal to the near history component if the longest matching string is selected from the far history component and sending a reset signal to the far history component if the longest matching string is selected from the near history component.

14. A compression method as in claim 11, further comprising:
storing an input string at a next buffer address in a far history buffer; and
storing said next buffer address at a hash of a token of said input string.

15. A compression method as in claim 14, wherein the hash table contains a set of entries for each hash value.

16. A compression method as in claim 15, further comprising matching a token for a current input to a prior location in the far history buffer.

17. A compression method as in claim 16, further comprising extending the match of the token to include a next input.

18. A compression method as in claim 17, wherein a longest matching string is sent to an encoder when the match cannot be extended to a next input.

* * * * *